(12) United States Patent
Jiang

(10) Patent No.: US 11,990,895 B2
(45) Date of Patent: May 21, 2024

(54) IIC HANG LINK RESTORATION CIRCUIT AND METHOD BASED ON PCA9511 CHIP

(71) Applicant: INSPUR SUZHOU INTELLIGENT TECHNOLOGY CO., LTD., Jiangsu (CN)

(72) Inventor: Bo Jiang, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 17 days.

(21) Appl. No.: 18/012,937

(22) PCT Filed: Jun. 30, 2021

(86) PCT No.: PCT/CN2021/103368
§ 371 (c)(1),
(2) Date: Dec. 25, 2022

(87) PCT Pub. No.: WO2022/057372
PCT Pub. Date: Mar. 24, 2022

(65) Prior Publication Data
US 2023/0268919 A1    Aug. 24, 2023

(30) Foreign Application Priority Data
Sep. 18, 2020    (CN) .......................... 202010990345.1

(51) Int. Cl.
*H03K 17/687*    (2006.01)
*G06F 13/40*    (2006.01)

(52) U.S. Cl.
CPC ......... *H03K 17/687* (2013.01); *G06F 13/405* (2013.01)

(58) Field of Classification Search
None
See application file for complete search history.

(56) References Cited

U.S. PATENT DOCUMENTS

2023/0268919 A1*    8/2023    Jiang .................... G06F 13/405
                                                     327/565

FOREIGN PATENT DOCUMENTS

| CN | 101609440 A | 12/2009 |
| CN | 102662452 A | 9/2012 |
| CN | 106354685 A | 1/2017 |
| CN | 108762455 A | 11/2018 |

(Continued)

OTHER PUBLICATIONS

PCT/CN2021/103368 international search report.

*Primary Examiner* — Kenneth B Wells
(74) *Attorney, Agent, or Firm* — IPro, PLLC

(57) ABSTRACT

An IIC hang link restoration circuit based on a PCA9511A chip, including: a PCA9511A chip, a negation circuit, and an external MOS tube (Q1). An IC bus inside the PCA9511A chip includes a clock line; the PCA9511A chip has one end connected to a master of the IIC bus and the other end connected to a slave of the IIC bus; the PCA9511A chip is provided with input and output interfaces of the clock line, and a ready signal interface; the negation circuit has one end connected to the ready signal interface and the other end connected to a gate electrode of the external MOS tube (Q1), and a source electrode and a drain electrode of the external MOS tube (Q1) are respectively connected to the input interface and the output interface of the clock line of the PCA9511A chip.

20 Claims, 3 Drawing Sheets

(56) References Cited

FOREIGN PATENT DOCUMENTS

CN 112214343 A 1/2021
JP 2010055472 A 3/2010

* cited by examiner

IIC HANG LINK RESTORATION CIRCUIT AND METHOD BASED ON PCA9511 CHIP

CROSS-REFERENCE TO RELATED APPLICATION

The present disclosure claims the priority of the Chinese patent application filed on Sep. 18, 2020 before the CNIPA, China National Intellectual Property Administration with the application number of 202010990345.1 and the title of "IIC HANG LINK RESTORATION CIRCUIT AND METHOD BASED ON PCA9511 CHIP", which is incorporated herein in its entirety by reference.

FIELD

The present disclosure belongs to the technical field of IIC buses and, more particularly, to an IIC hang link restoration circuit and method based on PCA9511A chip.

BACKGROUND

PCA9511A (whose full name is hot swappable I2C-bus and SMBus bus buffer, a kind of chip) is only applied to hot swap of IIC slaves, such as hot plugging of a certain peripheral component interconnect express (PCIE) card to a server that runs normally. Hot swap causes a predictable short-time high pulse in a signal between the PCIE card and the server. If an IIC master and a certain IIC slave (multiple slaves may be mounted to an IIC bus) that are plugged to a bus are communicating with each other, the high pulse caused by plugging may scramble data in normal communication, resulting in a data error.

When PCA9511A is powered on, its "under voltage and initialization circuit" (UIC) sets a data line input interface, a data line output interface, a clock line input interface, and a clock line output interface in a high-impedance state, and switches on a clock line and a data line are all off. In such case, switches in the data line input interface and the data line output interface are off, and switches in the clock line input interface and the clock line output interface are off. As a power supply voltage rises to meet a voltage level requirement of the chip, i.e., low-voltage detection of the UIC, and a voltage of an enable interface of the chip rises, in use, an enable pin is usually pulled up to the power supply voltage directly, and then the UIC enters an initialization phase. In this phase, a reference voltage and a pre-charging circuit have worked. In the last step of this phase, "STOP BIT ANND BUS IDLE" detection of the bus is started. If STOP BIT or BUS IDLE is detected, the bus sets the switches in the data line input interface and the data line output interface to be on and the switches in the clock input interface and the clock line output interface to be on. The switches in the interfaces remain on unless the chip is powered off. In FIG. 2, there is a hot swap event at the arrowhead, and the clock line of the slave disappears suddenly. An internal logic of the slave needs to transmit new data on a jumping edge of each clock line. Due to the disappearance of the clock line, there is no jumping edge that triggers the internal logic of the slave, and the slave keeps data of a beat unchanged. If data of a previous beat is of a low level, the slave keeps pulling down the data line, resulting in hanging of the bus.

This phenomenon is particularly common in a storage controller, for example:

scenario 1: a hot swap controller, where a battery back-up unit (BBU) remains charged in the whole process, and thus hangs an IIC bus that interconnects the BBU and a microcontroller unit (MCU); and scenario 2: a hot swap controller, where a controller at the other end remains charged, so a BMC IIC bus for interaction between the two controllers is hanged (the whole storage controller has two controllers that are mutually mirrored).

After the IIC bus is hanged, the master usually sends nine CLOCK signals on serial clock (SCL) to repair the bus.

However, PCA9511A is unplugged and powered off together when the master of the IIC bus is unplugged, and is powered on again with plugging of the master of the IIC bus. When it is detected that the level of the data line on the side of the slave of the bus is a low level, PCA9511A may keep the switch therein off. Under this condition, a link between the master and the slave is off, so the repair method based on nine CLOCK signals may not work, and it is hard to correct a fault.

SUMMARY

For the foregoing shortcomings of the prior art, the present disclosure provides an IIC hang link restoration circuit based on a PCA9511A chip, to solve the foregoing technical problems.

In a first aspect, the present disclosure provides an IIC hang link restoration circuit based on a PCA9511A chip, including: a PCA9511A chip, an inversion circuit, and an external metal-oxide-semiconductor field-effect transistor (MOSFET) Q1; an IIC bus in the PCA9511A chip includes: a clock line; one end of the PCA9511A chip is connected to a master of the IIC bus, and the other end of the PCA9511A chip is connected to a slave of the IIC bus; the PCA9511A chip is provided with an input interface and an output interface of the clock line and a ready signal interface; one end of the inversion circuit is connected to the ready signal interface, and the other end of the inversion circuit is connected to a gate electrode of the external MOSFET Q1; and a source electrode and a drain electrode of the external MOSFET Q1 are connected to the input interface and the output interface of the clock line of the PCA9511A chip.

In an embodiment, the inversion circuit includes a metal-oxide-semiconductor field-effect transistor (MOSFET) Q2, wherein a gate electrode of the MOSFET Q2 is connected to the ready signal interface, and a source electrode of the MOSFET Q2 is connected to the gate electrode of the external MOSFET Q1.

In an embodiment, the source electrode of the external MOSFET Q1 is connected to the input interface of the clock line of the PCA9511A chip; and the drain electrode of the external MOSFET Q1 is connected to the output interface of the clock line of the PCA9511A chip.

In an embodiment, the ready signal interface is connected to a pull-up resistor, and the pull-up resistor is connected to a 3.3V power supply.

In an embodiment, a source electrode of a MOSFET Q2 is connected to a protective resistor, and the protective resistor is connected to ground.

In an embodiment, a drain electrode of a MOSFET Q2 is connected to a pull-up resistor, and the pull-up resistor is connected to a 3.3V power supply.

In a second aspect, the present disclosure provides an IIC hang link restoration method based on the PCA9511A chip, where the link restoration method includes:

after hanging of an IIC bus, a PCA9511A chip is plugged into a master of the IIC bus to be powered on again;

a switch in the PCA9511A chip is off, and a ready signal is of a low level;

the ready signal is inverted to a high level, so as to switch on an external MOSFET Q1; and after the external MOSFET Q1 is switched on, a new clock line channel is formed outside the PCA9511A chip.

In an embodiment, when the IIC bus is normal in service, the ready signal is of a high level, the external MOSFET Q1 is off, and only an original clock line channel inside the PCA9511A chip is conducted between the input interface and the output interface of the clock line.

In an embodiment, when the switch in the clock line of the PCA9511A chip is set to be on, the ready signal is of a high level, otherwise the ready signal is of a low level.

In an embodiment, the master of the IIC bus sends nine CLOCK signals on the new clock line channel for fault correction.

The present disclosure has the following beneficial effects.

The present disclosure provides an IIC hang link restoration circuit and method based on the PCA9511A chip, a clock line channel is set outside the PCA9511A chip after hanging of the IIC bus to restore communication between the master and the slave, such that the master sends nine CLOCK signals on the clock line for fault correction.

In addition, the present disclosure is reliable in design principle and simple in structure, and has broad application prospects.

BRIEF DESCRIPTION OF THE DRAWINGS

In order to more clearly explain the technical solution in the embodiment or the existing technology of the present disclosure, the following will briefly introduce the drawings that need to be used in the embodiment or the existing technology description. Obviously, the drawings in the following description are only the embodiment of the present disclosure. For a person skilled in the art, other drawings may be obtained according to the provided drawings without paying creative labor.

DETAILED DESCRIPTION

Figure 1:
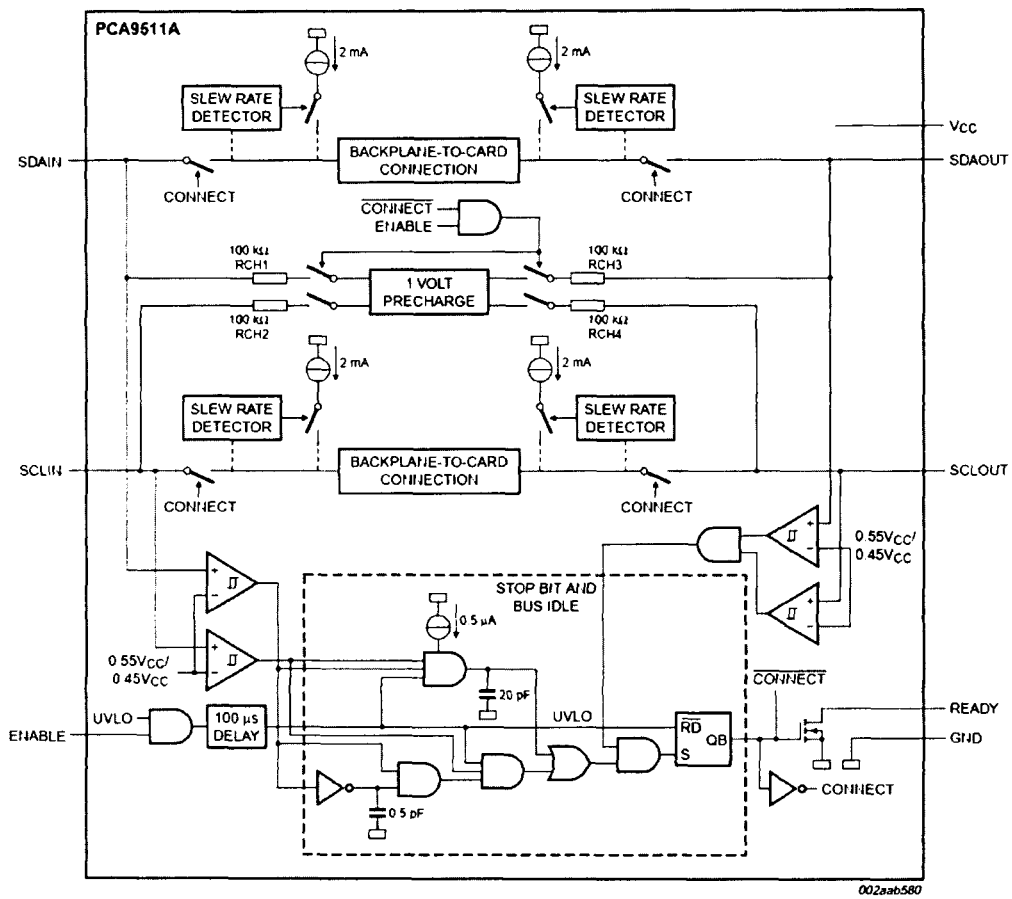
FIG. 1 is a structural diagram of an internal circuit of a PCA9511A chip according to the prior art related to the present disclosure.
Figure 2:
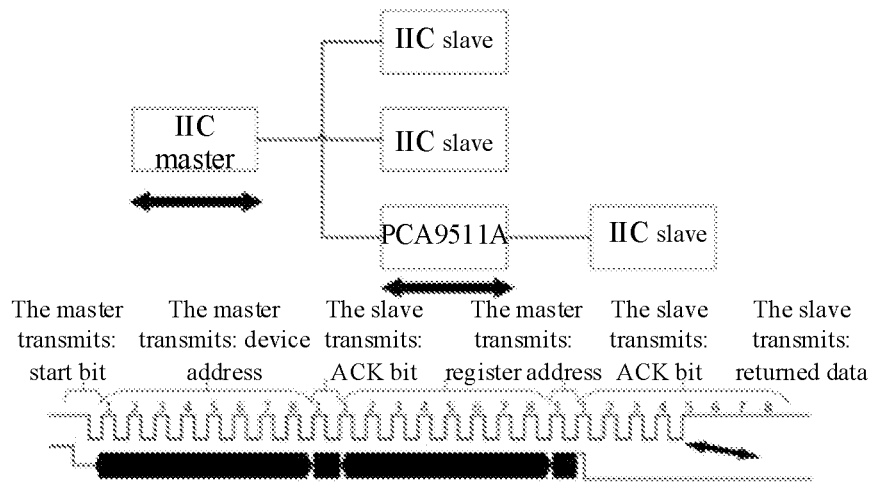
FIG. 2 is a schematic pulse diagram of a master and slave of an IIC bus according to the prior art related to the present disclosure.
Figure 3:
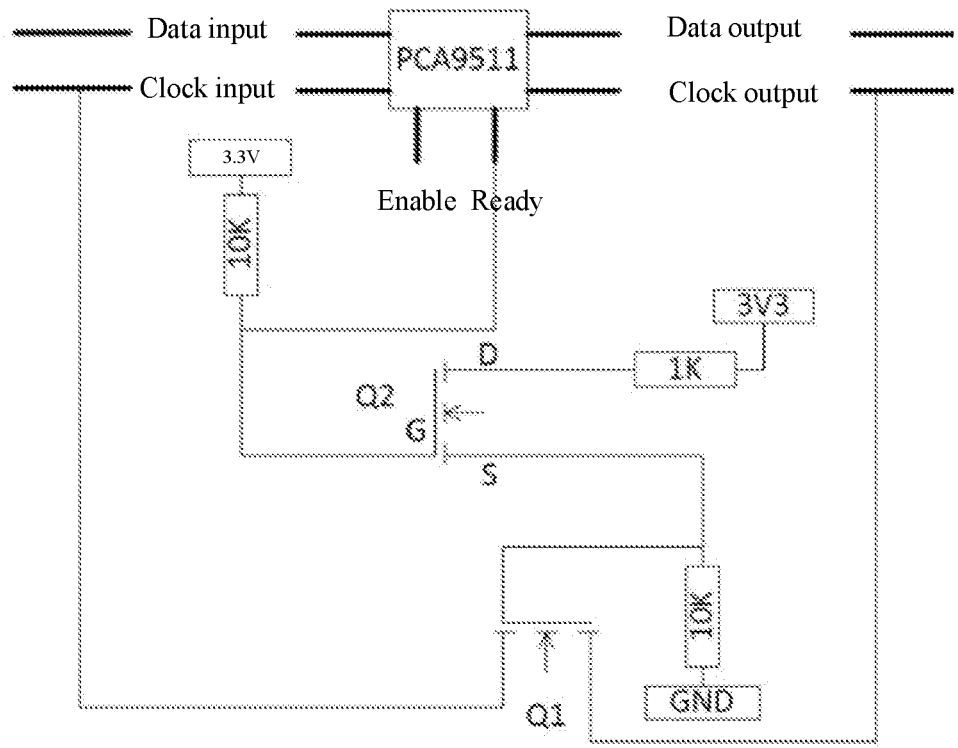
FIG. 3 is a schematic structural diagram of a circuit according to an embodiment of the present disclosure.
Figure 4:
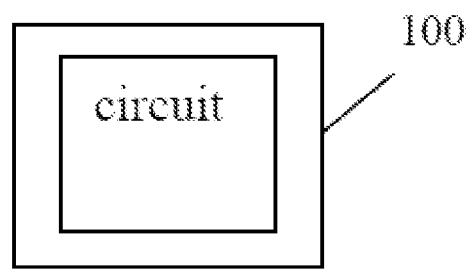
FIG. 4 is a schematic structural diagram of a circuit board according to an embodiment of the present disclosure.

In order that a person skilled in the art may understand the technical solution better in the present disclosure, a more complete description of the embodiments of the present disclosure will be rendered by reference to the appended drawings, which are provided for purposes of illustration and are not intended to be exhaustive of or limiting the present disclosure. All the other embodiments obtained by a person of ordinary skill in the art based on the embodiments in the present application without involving any inventive effort shall fall within the scope of the present application.

In the description of the present disclosure, it is necessary to understand that the terms 'first', 'second', etc. are used only for descriptive purposes and may not be understood as indicating or implying relative importance or implicitly specifying the number of technical features indicated. Thus, a feature defined as 'first', 'second', etc., may explicitly or implicitly include one or more of the features. In the description of the present disclosure, 'multiple' means two or more unless otherwise stated.

In the description of the present disclosure, it should be noted that the terms 'installation' and 'connection' are to be understood broadly unless otherwise specified and defined, for example, they may be fixed connections, detachable connections, or integral connections; it may be mechanical connection or electrical connection; it may be directly connected or indirectly connected through an intermediate medium, which may be the internal connection of two components. For a person skilled in the art, the above terms may be understood on a case-by-case basis.

In some embodiments, the present disclosure provides an IIC hang link restoration circuit based on the PCA9511A chip, including: a PCA9511A chip, an inversion circuit, and an external MOSFET Q1. An IIC bus in the PCA9511A chip includes a data line and a clock line. One end of the PCA9511A chip is connected to a master of the IIC bus, and the other end of the PCA9511A chip is connected to a slave of the IIC bus. The PCA9511A chip is provided with an input interface and an output interface of the data line and an input interface and an output interface of the clock line. The PCA9511A chip is provided with a ready signal interface. One end of the inversion circuit is connected to the ready signal interface, and the other end of the inversion circuit is connected to a gate electrode of the external MOSFET Q1. A source electrode and a drain electrode of the external MOSFET Q1 are connected to the input interface and the output interface of the clock line of the PCA9511A chip. The data line is a data transmission channel of the IIC bus. When SCL is of a high level, serial data (SDA) switches from a high level to a low level, which starts data transmission. When SCL is of a high level, SDA switches from a low level to a high level, and ends data transmission. That is, the data line is on only when the clock line is on.

Further, the inversion circuit includes a MOSFET Q2, where a gate electrode of the MOSFET Q2 is connected to the ready signal interface, and a source electrode of the MOSFET Q2 is connected to the gate electrode of the MOSFET Q1.

Further, the source electrode of the external MOSFET Q1 is connected to the input interface of the clock line of the PCA9511A chip; and the drain electrode of the external MOSFET Q1 is connected to the output interface of the clock line of the PCA9511A chip.

Further, the ready signal interface is connected to a pull-up resistor, and the pull-up resistor is connected to a 3.3V power supply.

Further, a source electrode of an MOSFET Q2 is connected to a protective resistor, and the protective resistor is connected to ground.

Further, a drain electrode of a MOSFET Q2 is connected to a pull-up resistor, and the pull-up resistor is connected to a 3.3V power supply.

Embodiment 2

The present embodiment provides an IIC hang link restoration method based on the PCA9511A chip, including:

S1, when an IIC bus is normal in service, a ready signal is of a high level, an external MOSFET Q1 is off, and only an original clock line channel inside the PCA9511A chip is conducted between the input interface and the output interface of the clock line.

S2, after hanging of the IIC bus, the PCA9511A chip is plugged into a master of the IIC bus to be powered on again.

S3, the ready signal is of a high level when the switch in the clock line of the PCA9511A chip is set to be on, otherwise the ready signal is of a low level; and after hanging of the IIC bus, the switch in the PCA9511A chip is off, and the ready signal is of a low level.

S4, the ready signal is inverted to a high level, so as to switch on the external MOSFET Q1; and after the external MOSFET Q1 is switched on, a new clock line channel is formed outside the PCA9511A chip.

S5, the master of the IIC bus sends nine CLOCK signals on the clock line on the new clock line channel for fault correction.

The present disclosure provides a circuit board 100, including the IIC hang link restoration circuit based on a PCA9511A chip stated above.

Although the present disclosure is described in detail by referring to the drawings and the corresponding embodiments, the present disclosure is not limited to this. Without departing from the spirit and substance of the present disclosure, a person skilled in the art may make various equivalent modifications or substitutions to the embodiments of the present disclosure, and these modifications or substitutions shall be within the coverage of the present disclosure or a person skilled in the art may easily think of changes or substitutions within the technical scope revealed by the present disclosure and shall be covered by the scope of protection of the present disclosure. Therefore, the scope of protection of the present disclosure shall be based on that of the claims.

The invention claimed is:

1. An IIC hang link restoration circuit based on a PCA9511A chip, comprising: a PCA9511A chip, an inversion circuit, and an external MOSFET; an IIC bus in the PCA9511A chip comprises a clock line; one end of the PCA9511A chip is connected to a master of the IIC bus, and the other end of the PCA9511A chip is connected to a slave of the IIC bus; the PCA9511A chip is provided with an input interface and an output interface of the clock line and a ready signal interface; one end of the inversion circuit is connected to the ready signal interface, and the other end of the inversion circuit is connected to a gate electrode of the external MOSFET, and a source electrode and a drain electrode of the external MOSFET are connected to the input interface and the output interface of the clock line of the PCA9511A chip.

2. The IIC hang link restoration circuit based on the PCA9511A chip according to claim 1, wherein the inversion circuit comprises an additional MOSFET, wherein a gate electrode of the additional MOSFET is connected to the ready signal interface, and a source electrode of the additional MOSFET is connected to the gate electrode of the external MOSFET.

3. The IIC hang link restoration circuit based on the PCA9511A chip according to claim 1, wherein the source electrode of the external MOSFET is connected to the input interface of the clock line of the PCA9511A chip; and the drain electrode of the external MOSFET is connected to the output interface of the clock line of the PCA9511A chip.

4. The IIC hang link restoration circuit based on the PCA9511A chip according to claim 1, wherein the ready signal interface is connected to a pull-up resistor, and the pull-up resistor is connected to a 3.3V power supply.

5. The IIC hang link restoration circuit based on the PCA9511A chip according to claim 1, wherein a source electrode of an additional MOSFET is connected to a protective resistor, and the protective resistor is connected to ground.

6. The IIC hang link restoration circuit based on the PCA9511A chip according to claim 1, wherein a drain electrode of an additional MOSFET is connected to a pull-up resistor, and the pull-up resistor is connected to a 3.3V power supply.

7. An IIC hang link restoration method based on a PCA9511A chip according to claim 1, comprising:
after hanging of the IIC bus, the PCA9511A chip is plugged into the master of the IIC bus to be powered on;
a switch in the PCA9511A chip is off, and a ready signal is of a low level;
the ready signal is inverted to a high level, to switch on the external MOSFET; and
after the external MOSFET is switched on, a new clock line channel is formed outside the PCA9511A chip, and link restoration is performed based on the new clock line channel.

8. The IIC hang link restoration method based on the PCA9511A chip according to claim 7, further comprising: when the IIC bus is normal in service, the ready signal is of a high level, the external MOSFET is off, and only an original clock line channel inside the PCA9511A chip is conducted between the input interface and the output interface of the clock line.

9. The IIC hang link restoration method based on the PCA9511A chip according to claim 7, further comprising: when the switch in the PCA9511A chip is set to be on, the ready signal is of a high level, otherwise the ready signal is of a low level.

10. The IIC hang link restoration method based on the PCA9511A chip according to claim 7, wherein the master of the IIC bus sends nine CLOCK signals on the new clock line channel for fault correction.

11. The IIC hang link restoration method based on the PCA9511A chip according to claim 7, wherein the inversion circuit comprises an additional MOSFET, wherein a gate electrode of the additional MOSFET is connected to the ready signal interface, and a source electrode of the additional MOSFET is connected to the gate electrode of the external MOSFET.

12. The IIC hang link restoration method based on the PCA9511A chip according to claim 7, wherein the source electrode of the external MOSFET is connected to the input interface of the clock line of the PCA9511A chip; and the drain electrode of the external MOSFET is connected to the output interface of the clock line of the PCA9511A chip.

13. The IIC hang link restoration method based on the PCA9511A chip according to claim 7, wherein the ready signal interface is connected to a pull-up resistor, and the pull-up resistor is connected to a 3.3V power supply.

14. The IIC hang link restoration method based on the PCA9511A chip according to claim 7, wherein a source electrode of an additional MOSFET is connected to a protective resistor, and the protective resistor is connected to ground.

15. The IIC hang link restoration method based on the PCA9511A chip according to claim 7, wherein a drain electrode of an additional MOSFET is connected to a pull-up resistor, and the pull-up resistor is connected to a 3.3V power supply.

16. A circuit board, comprising the IIC hang link restoration circuit based on a PCA9511A chip according to claim 1.

17. The circuit board according to claim 16, wherein the inversion circuit comprises an additional MOSFET, wherein a gate electrode of the additional MOSFET is connected to the ready signal interface, and a source electrode of the additional MOSFET is connected to the gate electrode of the external MOSFET.

18. The circuit board according to claim 16, wherein the source electrode of the external MOSFET is connected to the input interface of the clock line of the PCA9511A chip; and the drain electrode of the external MOSFET is connected to the output interface of the clock line of the PCA9511A chip.

19. The circuit board according to claim 16, wherein the ready signal interface is connected to a pull-up resistor, and the pull-up resistor is connected to a 3.3V power supply.

20. The circuit board according to claim 16, wherein a source electrode of an additional MOSFET is connected to a protective resistor, and the protective resistor is connected to ground.

\* \* \* \* \*